United States Patent [19]

Dierckx et al.

[11] Patent Number: 4,803,648

[45] Date of Patent: Feb. 7, 1989

[54] ECHO CANCELLER USING AN ADAPTIVE FINITE IMPULSE RESPONSE FILTER

[75] Inventors: Rudolf F. I. Dierckx, Wilrijk; Daniel Sallaerts, Aarschot; Pierre-Paul F. Guebels, Edegem, all of Belgium

[73] Assignee: Alcatel N.V., Amsterdam, Netherlands

[21] Appl. No.: 749,354

[22] Filed: Jun. 27, 1985

[30] Foreign Application Priority Data

Jul. 12, 1984 [EP] European Pat. Off. ........ 84201049.8

[51] Int. Cl.⁴ ............................................. G06F 15/31
[52] U.S. Cl. ................................. 364/724.19; 379/411
[58] Field of Search ................ 364/724; 370/32, 32.1; 379/406, 410, 411

[56] References Cited

U.S. PATENT DOCUMENTS

| | | | |
|---|---|---|---|
| 4,007,341 | 2/1977 | Sourgens et al. | 364/724 |
| 4,369,499 | 1/1983 | Northam | 364/724 |
| 4,386,430 | 5/1983 | Treiber | 364/724 |
| 4,425,483 | 1/1984 | Lee et al. | 379/411 |
| 4,493,048 | 1/1985 | Kung et al. | 364/724 |
| 4,507,725 | 3/1985 | Christopher et al. | 364/724 |
| 4,539,675 | 9/1985 | Fisher | 370/32.1 |
| 4,569,031 | 2/1986 | Backes | 364/724 |
| 4,571,720 | 2/1986 | Chevreau et al. | 379/411 |
| 4,574,166 | 3/1986 | Gritton | 370/32.1 |
| 4,582,963 | 4/1986 | Danstrom | 379/411 |
| 4,588,255 | 5/1986 | Tur et al. | 364/728 |
| 4,591,669 | 5/1986 | Duttweiler et al. | 364/724 |
| 4,621,173 | 11/1986 | Guidoux | 370/32.1 |
| 4,683,496 | 7/1987 | Tom | 358/166 |

FOREIGN PATENT DOCUMENTS 0111938 6/1984 European Pat. Off. .
0201281 11/1986 European Pat. Off. ............ 364/724

OTHER PUBLICATIONS

"Let's Design Algorithms for VLSI Systems" by H. T. Kung, Cal Tech Conference on VLSI, Jan. 1979, pp. 65-90.
"A Systolic Processor for Signal Processing" by G. A. Frank et al., National Computer Conference, 1982, pp. 225-231.
Digital Signal Processing Application of Systolic Algorithms, Cappello et al., Proc. of Carnegie Mellon Univ. on VLSI Systems & Compuitations, 1981, Pittsburgh Computer Science Press, pp. 246-264.
"A Two-Level Pipelined Systolic Array for Convolutions" H. T. Kung et al., pp. 255-263, Proc. of Carnegie Mellon Univ. on VLSI Systems and Computations, 1981, Pittsburgh Computer Press.

Primary Examiner—Gary V. Harkcom
Assistant Examiner—Dale M. Shaw
Attorney, Agent, or Firm—Spencer & Frank

[57] ABSTRACT

An echo canceller, using an Adaptive Finite Input Response Filter (AFIR), uses a processing device with a plurality of interconnected cells. These cells, connected in a systolic arrangement, determines the function of three variables m, n, and p, in the equation p+m n, where m and n are data inputs to each of the cells, and p is the output of a previous calculation cell. This is achieved by using a timing sequence, in which the variable m is applied bit serial to the cells over a period of q time slots, and the variable n is applied in parallel over the cells in one time slot.

14 Claims, 10 Drawing Sheets

ECHO CANCELLER USING AN ADAPTIVE FINITE IMPULSE RESPONSE FILTER

BACKGROUND OF THE INVENTION

The present invention relates to a signal processing arrangement including at least one processing device with a series of interconnected processing cells which are each able to calculate a same function of three periodic variables m, n and p which are applied to first, second and third inputs of said cell which further has a first output connected lto the first input of a following cell considered in this direction from a first cell to a last cell and a second output on which appears the result of said calculation, said variable being the result of a previous calculation and corresponding variables applied to said cell and provided by said cells being successively time shifted with respect to one another.

Such a processing arrangement and more particularly a systolic processor is already known from the article "Let's Design Algorithms for VLSI Systems" by H.T. Kung, Caltech Conference on VLSI, January 1979, pp. 65 to 90 and more particularly pp. 74--78.

SUMMARY OF THE INVENTION

An object of the present invention is to provide a signal processing arrangement of the above type but which is particularly simple although it is especially adapted to be used when the functions to be calculated in the successive cells involve variables which are successively time shifted with respect to one another by a relatively large delay close to the period of the variable. If such a delay would be introduced between the first output of each cell and the first input of the following cell it could lead to an expensive solution. Indeed, particularly in a VLSI design, it would be advantageous to have digital operations carrie dout in successive time slots during each period of time corresponding to the availability of a variable at an input of a cell. Then, using a shift register to produce a delay close to the total period would imply a number of stages close to the total number of time slots in such a period and this number could be substantial. This would particularly be the case if the division of this period into time slots would be performed so as to allow the bit by bit calculation of a function involving variables with a large number of bits.

According to the invention, this object is achieved due to the fact that each of said cells includes calculation means which are able to calculate said function in a bit serial way and provide an output bit in every time slot, with said variable m ($T_{i-k}$) having a duration of q (32) time slots and said variable n ($K_{k, i}$, $D_i$) comprising a number of at most q bits each having a duration of one time slot, and that in each cell said first input is connected to said first output via a sample and hold circuit whose output is connected to an input of said calculation means to supply said variable m thereat, the sample and hold circuits of said successive cells being controlled by respective ones of time shifted control signals which are successively delayed with respect to one another by one time slot when considered in a direction opposite to said first mentioned one, in such a way that the variables m supplied to said successive cells are mutually delayed by q−1 time slots when considered in said first mentioned direction.

Thus, by performing each calculation in a bit serial way and by providing an output bit in each time slot the calculation means of each cell operate rapidly and can be relatively simple, e.g. include a 1-bit multiplier and a 1-bit adder which can be integrated on a relatively small area. Moreover, by the use of the above mentioned control signals only delays of one time slot are required to obtain the relatively large time shift between the signals m applied to the respective cells.

BRIEF DESCRIPTION OF THE DRAWINGS

The above mentioned and other objects and features of the invention will become more apparent and the invention itself will be best understood by referring to the following description of an embodiment taken in conjunction with the accompanying drawings wherein.

DETAILED DESCRIPTION OF THE PREFERRED EMBODIMENT

Figure 1:
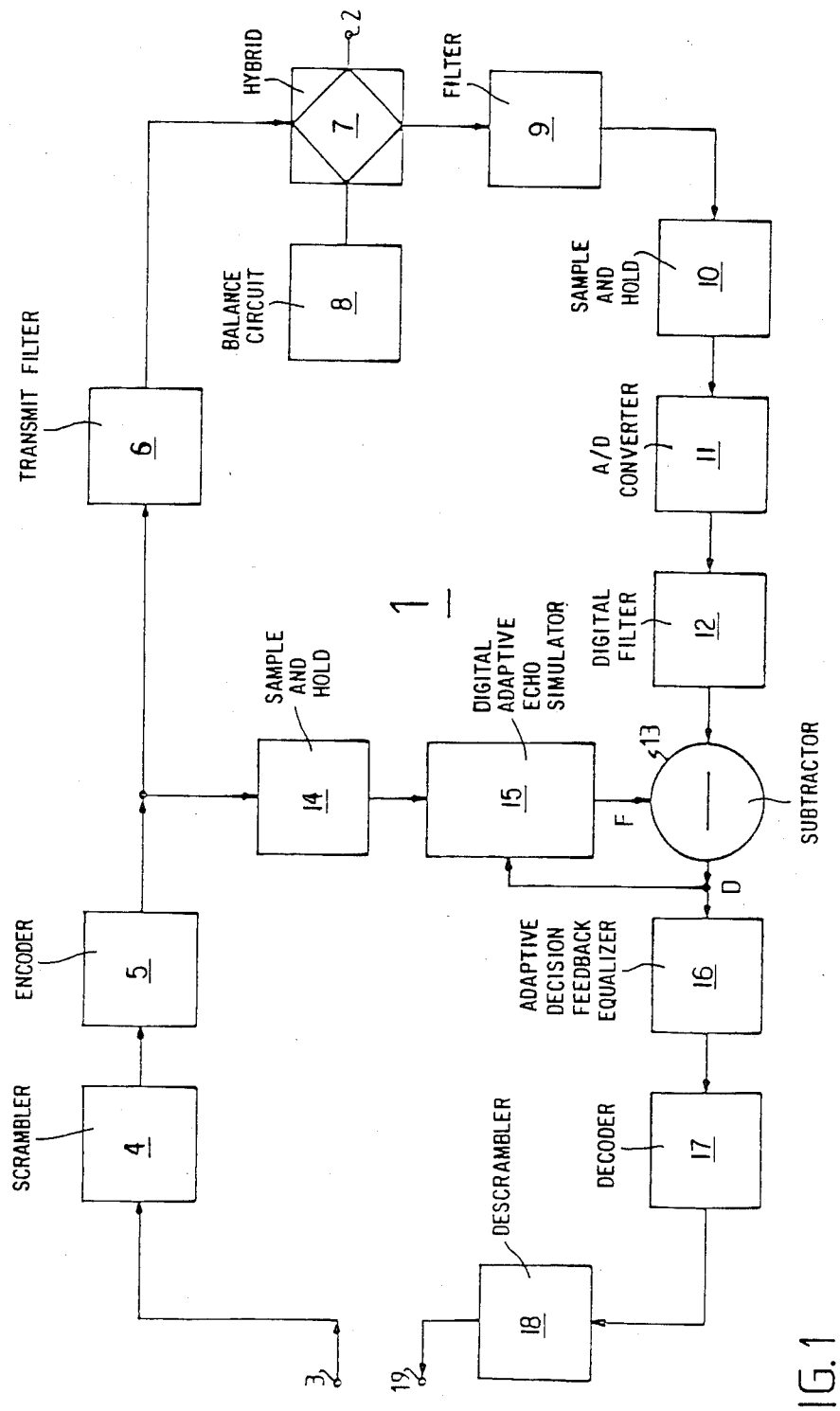
FIG. 1 shows a transmission system according to the prior art, but using a signal processing arrangement 15 according to the invention.

FIG. 1 shows a transmission station 1 of a prior art digital transmission system disclosed in Belgian Pat. No. 895 066 (D.A.FISHER 3). Therein digital data such as PCM is conveyed in either one of two directions over a single transmission line 2. This transmission station 1 is connected to one end of this line and a similar station (not shown) is connected to the other end thereof. Each transmission station has a transmit path and a receive path.

In the transmit path, binary data symbols 3 to be transmitted are initially processed in a scrambler 4 to eliminate auto-correlation in the transmitted data and correlation between data signals transmitted in the two directions of transmission. An encoder 5 transforms the binary output data symbols of the scrambler 4 into digital ternary symbols which are transmitted on the line 2 via a transmit filter 6 and a hybrid circuit 7 coupled to a balance circuit 8, the output signals of the transmit filter 6 being analog signals. This transmit filter 6 reduces high frequency energy applied to the filter at frequencies higher than half the symbol rate.

In the receive path the hybrid circuit 7 is coupled through a filter 9 and a sample and hold circuit 10 in series to an analogue-to-digital converter 11. The filter 9 limits the spectrum of the received analog signals to half the symbol rate and the converter 11 converts the sampled signals into a digital form suitable for processing in the rest of the receive path.

Each received data signal in fact comprises a wanted signal received from the far end and an unwanted signal due to the imperfect operation of the hybrid circuit 7.

The output data signals of the converter 11 are supplied to one terminal of a subtractor 13 via a digital filter 12. The data signals generated at the output of the encoder 5 are supplied to the other terminal of the subtractor 13 through a sample and hold circuit 14 and a digital adaptive echo simulator 15 which is also controlled by the error signal produced at the output D of the subtractor 13. This simulator 15 is for instance a digital adaptive transversal filter which adjusts automatically to match the trans-hybrid impulse response, which is the impulse response from the transmit path to the subtractor 13, until the last mentioned error signal from the latter subtractor has substantially no local signal content. It generates an output for each sampled input value from the sample and hold circuit 14.

The error signal generated at the output D of the subtractor 13 is also applied to an adaptive decision feedback equalizer 16 whose purpose is to detect the received symbol value and to remove intersymbol interference between received symbols due to the transmission on the line. THe output signal of the equalizer 16 is also applied to a decoder 17 which is in effect the inverse of the encoder 5. The output signal of the decoder 17 is applied to a descrambler 18 whose output is the receive signal output 19.

The adaptive filter 15 is an n+1 tap filter able to calculate the following functions for each time period i during which a periodic input symbol Ti is applied to it $$F = \sum_{k=0}^{n} K_{k,i} \cdot T_{i-k} \quad (1)$$

with $$K_{k,i} = D_i \cdot T_{i-k} + K_{k,i-1} \quad (2)$$

wherein $K_{k,i}$ are the filter coefficients and $D_i$ is the error signal generated at the output D of the subtractor 13 during a time period i.

The function (1) may be obtained by calculating successively the following partial results or inner products:

$$P_{n,i} = K_{n,i} \cdot T_{i-n} \quad (3)$$

$$P_{n-1,i} = K_{n-1,i} \cdot T_{i-n} + P_{n,i}$$

$$\vdots$$

$$P_{1,i} = K_{1,i} \cdot T_{i-1} + P_{2,i}$$

$$F = P_{0,i} = K_{0,i} \cdot T_i + P_{1,i}$$

The latter partial results are thus of the general form:

$$P_{k,i} = K_{k,i} \cdot T_{i-k} + P_{k+1,i} \quad (4)$$

for k=0 to n−1 and with $P_{n,i} = 0$ (5)

and $P_{0,1} = F$ (6)

The function (1) may therefore be calculated by means of a so-called systolic processor with n+1 interconnected cells able to calculate respective ones of the inner products $P_{k,i}$ given by the relation (4). Also the functions (2) may be calculated in a similar way in respective cells of a systolic processor because each of them is of the same type as the function (4). Each of the functions (2) and (4) may be calculated on a bit parallel or word basis, but in this case a multi-bit multiplier and a multi-bit full adder are required in each cell. Such a multiplier and adder necessitate a relatively large area when integrated on a chip.

On the contrary, when the filter 15 computes the above functions on a bit serial basis in each cell, use may be made, in time multiplex, of a 1-bit multiplier and of a 1-bit adder which can be integrated on a relatively small chip area. Such a bit serially operated adaptive transversal filter 15 is described hereinafter by making reference to FIG. 2.

Figure 2:
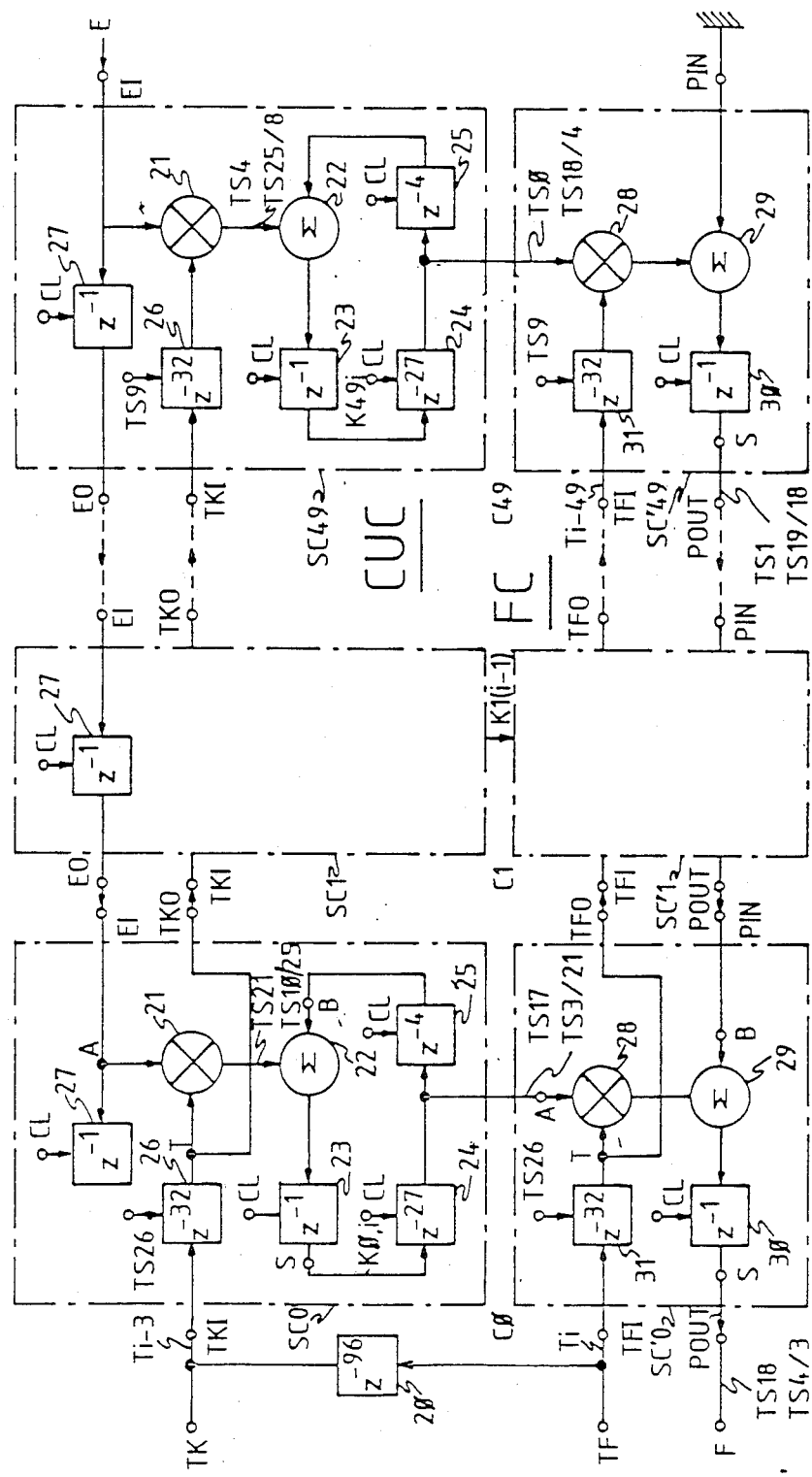
FIG. 2 is a schematic diagram of an embodiment of this signal processing arrangment 15.

The filter 15 shows therein is adapted to calculate the filter output signal F according to the relation (3) by successively calculating the inner products $P_{k,i}$ and to use this filter output signal and the above mentioned error signal to calculate the filter coefficients according to the relation (2). It is assumed that the latter filter coefficient $K_{k,i}$ (before truncation) are words with K=32 bits with a bit rate equal to 32 times 120 kbit/sec which is the bit rate of the input symbols $T_{i-k}$. For this reason, use is made of a clock CL (not shown) which defines series of 32 time slots numbered TS0 to TS31 each having the duration of one bit. In FIG. 2 delays of p time slots are indicated by $z^{-p}$, wherein z is the z-operator.

The digital adaptive transversal filter 15 shown comprises a digital transversal filter circuit proper FC for computing the filter output signal F and a digital filter coefficient updating circuit CUC for calculating the updated filter coefficients for the circuit FC. The circuit CUC has a symbol input TK and an error input E and comprises N+1=50 subcells SC0 to SC49 which are interconnected in two directions via the terminals EI, EO and TKI, TKO respectively. The circuit FC has a symbol input TF, a grounded input PIN, because $P_{n,i} = 0$ according to relation (5), and a filter output F and comprises N+1=50 subcells SC'0 to SC'49 which are also interconnected in two directions via the terminals TF1, TFO and PIN, POUT respectively. THe pairs of interconnected subcells SC0, SC'0 to SC49, SC'49 constitute the cells C0 to C49 of the adaptive filter respectively. The input TF is connected to the input TK via a delay unit 20 of 3 symbol periods or 96 time slots as indicated by $z^{-96}$. The reason for this delay will be explained later. The output F of the filter 15 is connected to an input of the subtractor 13 and the output of this subtractor 13 is connected to the error input E through other circuitry (not shown) giving rise to additional delays and performing a scaling operation. As a result, when the binary point of the filter output signal F for instance occurs in a time slot TS18, the binary point of an error signal Di which appears on error input E and which is a 16-bit signal occurs in a time slot TS4. The least significant bit LSB of this signal then cocurs in time slot TS25 whilst the most significant bit MSB occurs in time slot TS8.

Each subcell $SC_k$, i.e. SC0/49, of the filter coefficient updating circuit CUC includes a 1-bit multiplier 21 and a 1-bit adder 22 which together have an inherent delay of one time slot schematically represented by the delay unit 23 clocked by the clock CL and the input of which is connected to the output of the adder 22. The output S of the latter delay unit 23 is connected to an input B of this adder 22 via the delay units 24 and 25, clocked by CL, in series. The latter delay units 24 and 25 provide a delay equal to 27 and 4 time slots indicated by $z^{-27}$ and $z^{-4}$ respectively. Thus an updated filter coefficient $K_{k,i}$ produced at the output of the adder 27 of a subcell $SC_k$ is delayed by 32 time slots or 1 symbol period before being fed back to the input B of this adder 22, and by 28 time slots before being applied to the input A of the corresponding subcell $SC'_k$. The subcell $SC_k$ also includes a triggered delay unit 26 of one symbol period indicated by $z^{-32}$ and a delay unit 27 of one time slot clocked by Cl and indicated by $z^{-1}$. The outputs of the delay units 26 and 27 (of $SC_{k+1}$) are connected to respective inputs of the multiplier 21 whose output is connected to an input of the adder 22.

The triggered delay units 26 of the subcells SC0 to SC49 are connected in series between the input symbol terminal TK and the input of multiplier 21 of SC49. The delay units 26 of the subcells SC49 to SC0 are triggered during the successive time slots TS9 to TS26 respectively, for reasons which will be explained later. The delay units 27 of these subcells SC49 to SC0 are connected in series between the error input terminal E, i.e., terminal EI of subcell SC49, and the output terminal EO of subcell SC0.

Each subcell $SC'_k$, i.e. SC'0/49, of the transversal filter proper FC includes a 1-bit multiplier 28 and 1-bit adder 29 which together have an inherent delay of one time slot schematically represented by the delay unit 30 clocked by the clock CL and the input of which is connected to the output of the adder 29. The output S of the latter delay unit 30 is connected to an output POUT of the subcell $SC'_k$. This subcell $SC'_k$ also includes a triggered delay unit 31 of one symbol period indicated by $z^{-32}$. The outputs of the delay units 31 and 24 are connected to respective inputs of the multiplier 28 whose output is connected to an input of the adder 29.

The triggered delay units 31 of the subcells SC'0 to SC'49 are connected in series between the symbol input terminal TF and the input of multiplier 28 of SC'49. The delay units 31 of the subcells SC'49 to SC'0 are also triggered during the successive time slots S9 to TS26 respectively for reasons which will be explained later. The outputs POUT of the subcells SC'49 to SC'1 are connected to the inputs B of the adders 29 of the subcells SC'48 to SC'0 respectively via the PIN inputs of these subcells. The PIN input of SC'49 is grounded, as already mentioned.

Figure 3:
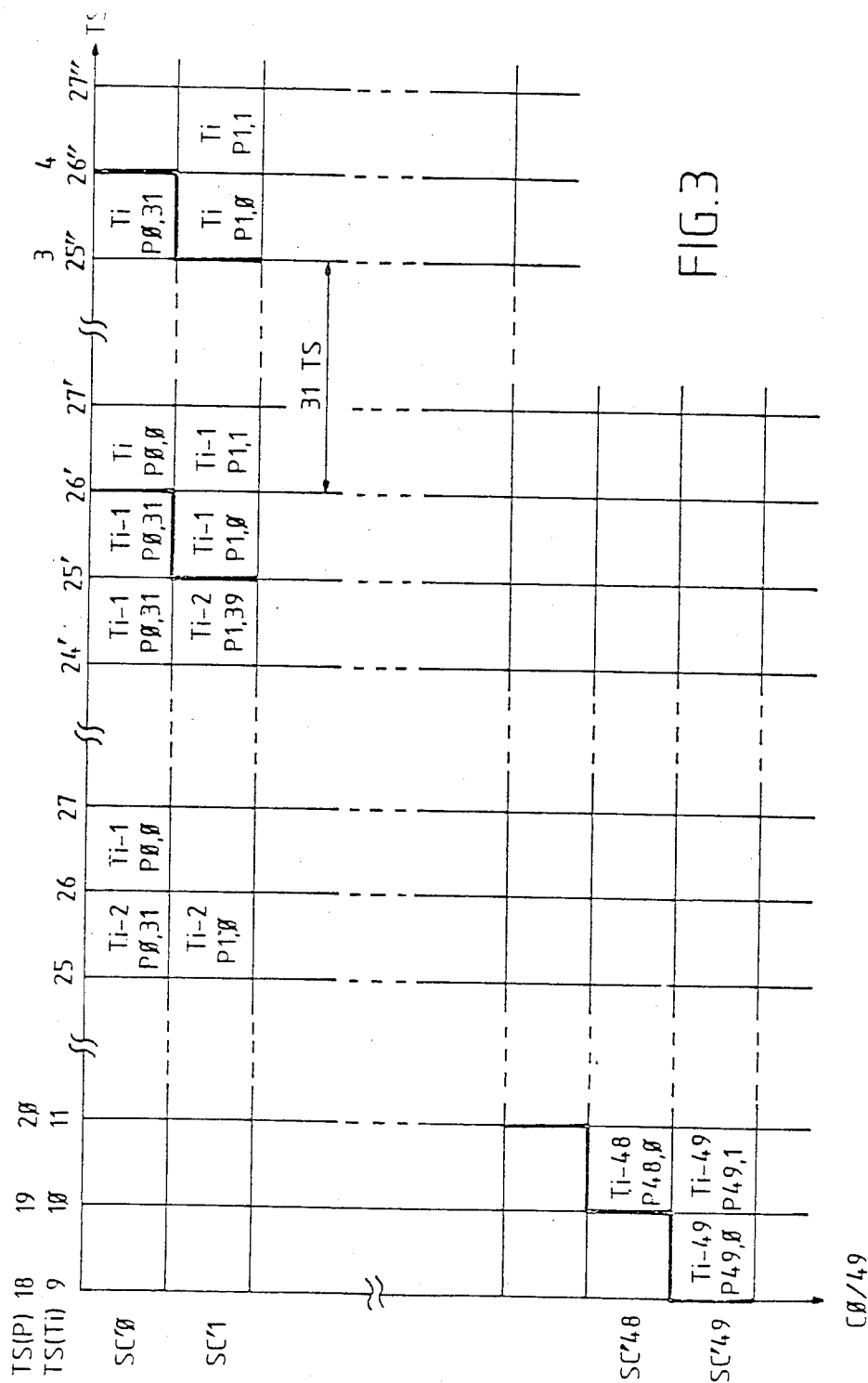
FIGS. 3 and 4 are time diagrams used to illustrate the operation of this arrangement.

Because the delay units 31 of the subcells SC'49 to SC'0 are triggered during 50 successive time slots TS9 to TS26' the symbols then applied to these subcells are entered therein. FIG. 3 shows how the symbols $T_{i-49}$ to $T_i$ are successively entered in the subcells SC'49 to SC'0 during the 50 successive time slots TS9 to TS26'. These symbols are really $T_{i-49}$ to $T_i$ because, as will be explained later, a symbol applied to a subcell is applied 31 time time slots later to the immediately following subcell. This is shown in FIG. 3, for the symbol $T_i$ which is entered in SC'0 in time slot TS26' and in SC'1 in time slot TS25" occurring 31 time slots later.

The same is true for the circuit CUC where the symbol $T_{i-3}$ is applied to SC0 when $T_i$ is applied to SC'0 so that the symbols $T_{i-52}$ to $T_{i-3}$ are entered in SC49 to SC0 when the symbols $T_{i-49}$ to $T_i$ are entered in SC'49 to SC'0.

From the above it follows that the symbol periods in the subcells SC0 to SC49 as well as those in the subcells SC'0 to SC'49 are time shifted by one time slot with respect to one another. In order that all the subcells SC0/49 should behave in exactly the same way in their respective shifted symbol periods, the error input signal Di applied to the error input E of subcell SC49 is each time also delayed by one time slot in a delay unit 27 before being applied to a following subcell. Because, as mentioned above, the binary point of the 16-bit error signal Di (FIG. 4) at error input E occurs in TS4, this binary point appears in the subcells SC49 to SC0 in the time slots TS4 to TS21 respectively. The LSB of this signal occurs in the same subcells SC49 to SC0 in the time slots TS25 to TS10 respectively, whereas the MSB occurs in the time slots TS8 to TS25 respectively. Because the input symbols are entered in these subcells in the 50 successive time slots TS9 to TS26 respectively, in each subcell and with respect to the respective symbol period the LSB of the error signal Di is received 16 time slots after the receipt of an input symbol, as is clearly shown in FIG. 4. Thus the bits of the error signal Di can be successively multiplied with this symbol.

Likewise, in the subcells SC'49 to SC'0 also the updated and delayed filter coefficients K49, i to K0, i applied to the multipliers 28 from the subcells SC49 to SC0 are shifted by one time slot. More particularly, in the subcells SC'49 to SC'0 the binary points of these coefficients occur in the time slots TS0 to TS17 respectively, whereas their LSB occur in the time slots TS18 to TS3 respectively and their MSB occur in the time slots TS4 to TS31 respectively. Because the input symbols are also entered in these subcells in 50 successive time slots TS9 to TS26 respectively, in each subcell and with respect to the respective symbol period the LSB of the last mentioned output signal is received 9 time slots after the receipt of an input symbol. Thus the bits of each filter coefficient can be successively multiplied with the corresponding input symbol.

The detailed operation of the subcells SC'0 and SC0 is given hereinafter, the operation of the other cells being identical.

Figure 4:
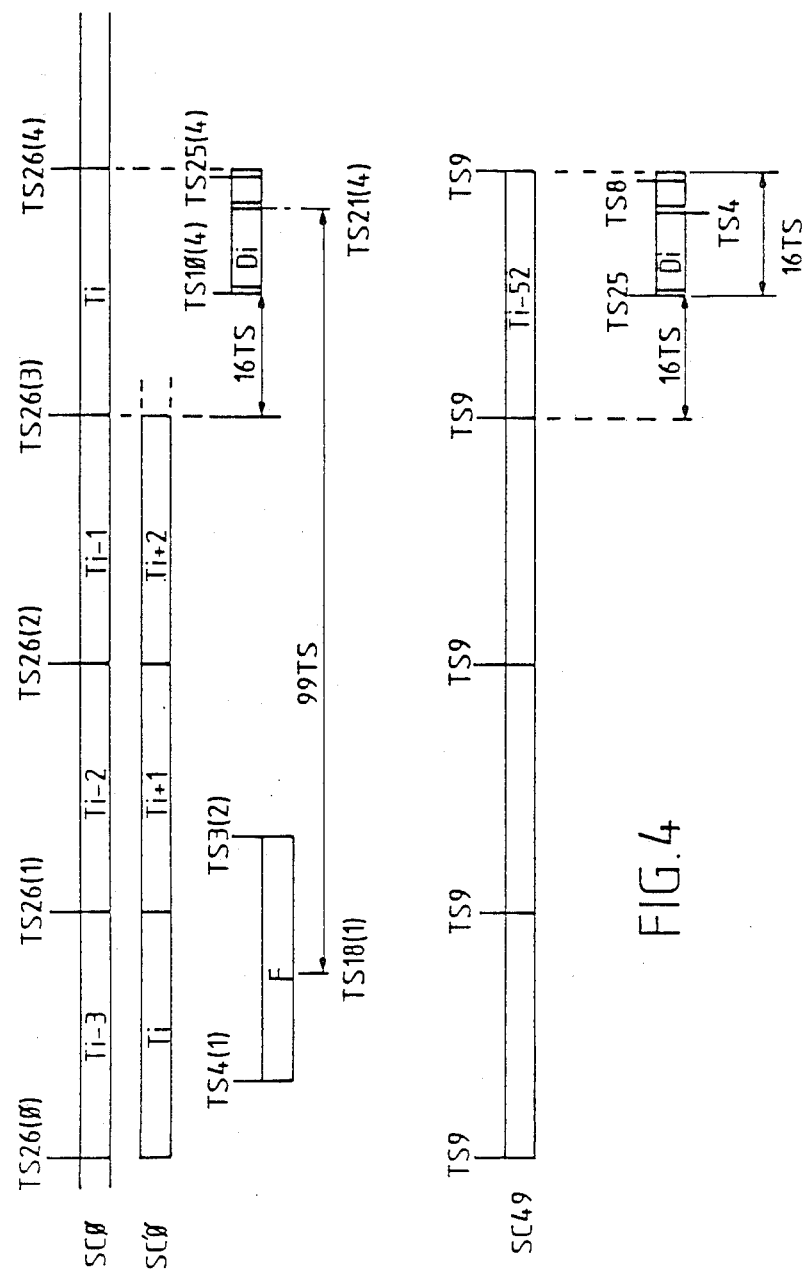

The input symbol $T_i$ is entered in SC'0 during a time slot TS26, e.g. TS26(0) in FIG. 4, whereas bit $K_{0,i,0}$ of rank 0 of the filter coefficient $K_{k,i}$ and bit $P_{1,i,0}$ of rank 0 of the inner product $P_{1,i}$ generated in SC1 are applied to the multiplier 28 and adder 29 in a time slot TS30 (not shown) following TS26(0) respectively. The input symbol $T_i$ is first multiplied in multiplier 28 with bit $K_{0,i,0}$ and the resulting product bit is added to bit $P_{1,i,0}$ to obtain a new bit $P_{0,i,0}$ of rank 0 of the inner product $P_{0,i}$ and a possible carry bit which for simplicity reasons is not considered further. Because of the inherent delay of one time slot produced by these operations and represented by delay unit 30 the last mentioned bit is produced in time slot TS4. In the following 31 time slots the bits of rank 1 to 31 of the inner product $P_{0,i}$ are calculated in the same way so that the filter signal F $= P_{0,i}$ appears at the output F of the filter during the 32 successive time slots TS4(1) to TS3(2) respectively. The binary point of this signal occurs in time slot TS18(1). This 32-bit word is then delayed in not shown circuitry and applied to the subtractor 13 which produces the above mentioned error signal Di. Because the error signal Di is caused by the input symbol $T_i$ and also by the preceding symbols $T_{i-1}$, $T_{i-2'}$, etc. it should be correlated with these symbols to obtain a signal which enables the filter coefficient $K_{k,i}$ to be updated. This is explained hereinafter.

After having been delayed and scaled the error signal at the output D of the subtractor 13 appears as a 16-bit signal Di at the error input D of SC49 of the circuit CUC during time slots TS25 to TS8 (FIG. 4). The binary point of this error signal Di occurs 50 time slots after the occurrence of the binary point of the filter output signal F. This error signal is further delayed in the 49 delay units 27 and its LSB an MSB are applied to the multiplier 21 of the subcell SC0 in the time slots TS10(4) and TS25(4) respectively. From FIG. 4 it follows that the symbol $T_i$ is entered in SC0 from TS26(3) to TS26(4). All the bits of Di may therefore be correlated with $T_i$. In the same way the error signal Di may be correlated with the symbols $T_{i-1}$, $T_{i-2}$, ..., $T_{i-52}$ in the subcells SC1 to SC49 since in these subcells both the symbol and the error signal have the same relative position as in subcell SC0, as shown in FIG. 4 for SC0 and SC49.

The correlation product is obtained in SC0 by multiplying the input symbol $T_i$ in multiplier 21 with the bit of rank 0 of the error signal Di during time slot TS10(4) (FIG. 4). This product bit is then added in adder 22 to the bit of rank 0, i.e. $K_{0,i-1,0}$ of the previous filter coefficient $K_{0,i-1}$ to obtain the bit of rank 0, i.e., $K_{0,i,0}$ of the updated filter coefficient $K_{0,i}$ and a possible carry bit which is not considered further. Because of the inherent delay of one time slot produced by these operations and represented by delay unit 23 the last mentioned bit is produced in TS11(4). In the following 31 time slots the bits of rank 1 to 31 of the filter coefficient $K_{0,i}$ are calculated in an analogous way so that this coefficient appears at the output S of delay unit 23 during the successive time slots TS11(4) to TS26(4), the binary point of this signal being in TS22(4). This 32-bit word is then delayed by 27 time slots in delay unit 24 applied to the input A of the corresponding subcell SC'0.

To be noted that the latter delay is only provided because it permits to bring the binary point and therefore also LSB and MSB of the filter coefficients in any wanted position. Of course, also the binary points LSB and MSB of the filter output signal are then affected. In this way the LSB of this filter output can for instance be brought in TS0 if necessary.

The operation of the other subcells is similar to the operation of SC0 and SC'0 just described and will therefore not be repeated. However, the evolution of the output signals of the subcells SC'49 to SC'0 will be briefly described hereinafter by making again reference to FIG. 3.

Because of the above mentioned time shift of one time slot such as shown in FIG. 3, the subcells SC'49 to Sc'0 successively calculate the bits of rank 0 of the inner products $P_{49, 49-i}$ to $P_{0,i}$ respectively. For simplicity reasons these bits are indicated without the subscript i, i−1, ... etc. in FIG. 3 and in the following. More particularly:

during TS18,SC'49 calculates bit $P_{49,0}$ of $P_{49}$ and applies this bit to subcell SC'48 in time slot TS10;

during TS19,SC'48 calculates bit $P_{48,0}$ of $P_{48}$ by means of bit $P_{49,0}$ just calculated and applies this bit to subcell SC'48 in time slot TS20, etc.;

during TS3, SC'0 calculates bit $P_{0,0}$ of $P_0$ by means of bit $P_{1,0}$ just calculated in SC'1 and applies this bit to the filter output F in time slot TS4.

The bits of other rank of the filter output signal are calculated in the same way. From the above it follows that by calculating each bit during a single time slot and by performing the calculation of bits of a same rank during shifted time slots each such bit can be immediately used for a following calculation in a preceding cell. Hence, the present arrangement operates with a great efficiency. Another advantage is that as a result of this asynchronous operation each symbol has only to be fed to a single cell and not to all cells simultaneously.

Thus, there is no danger of introducing unwanted delays between input symbols as is the case when these symbols are fed to all the cells simultaneously and when the number of cells is high.

Figure 5:
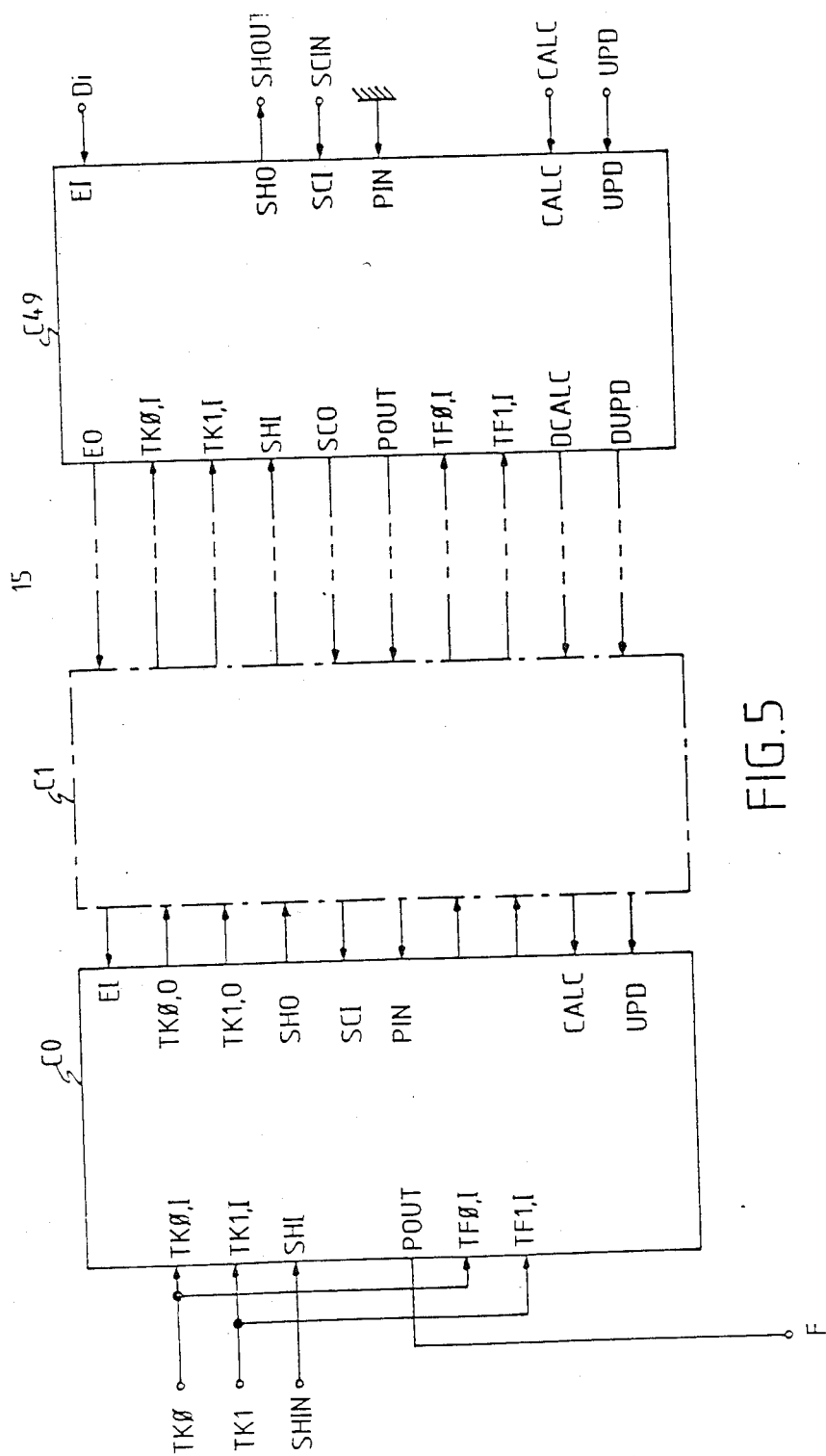
FIG. 5 represents a schematic diagram of an embodiment similar to that of FIG. 2.

Reference is now made to FIG. 5 showing an adaptive transversal filter circuit 15 similar to that of FIG. 2 and also comprising 50 cells C0 to C49 each having:

symbol input and output terminals TK0,I, TK1,I and TK0,O, TK1,O respectively. These terminals are substituted for the ternary symbol input and output terminals TKI and TKO of FIG. 2 respectively, the ternary symbol being now decoded in the following two-bit code, with bits T0 and T1, before being applied to the filter symbol input terminals TK0 and TK1 which are connected to input terminals TK0,I and TK1,I of C0 respectively:

| Ternary value | T1 | T0 |
|---|---|---|
| +1 | 0 | 1 |
| 0 | 0 | 0 |
| −1 | 1 | 1 | symbol input and output terminals TF0,I, TF1,I and TF0,O, TF1,O respectively, connected to the above mentioned terminals TK0,I, TK1,I, TK0,O and TK1,0 respectively;

filter input and output terminal PIN and POUT, terminal PIN of cell C49 being grounded and terminal POUT of cell C0 constituting the filter output terminal F;

error signal input and output terminals EI and EO, the terminal EI of SC49 constituting the error input E of the filter;

calculation control terminals CALC and DCALC, the terminal CALC of cell C49 constituting the filter input terminal CALC;

updating control terminals UPD and DUPD, the terminal UPD of cell C49 constituting the like named filter input terminal UPD;

shift input and output terminals SHI and SHO, the terminal SHI of cell C0 and terminal SHO of cell C49 constituting the filter shift input and output terminals SHIn and SHOUT, respectively;

shift control terminals SCI and SCO, terminal SCI of cell C49 and terminal SCO of cell C0 constituting the filter shift control input and output terminals SCIN and SCOUT respectively.

Figure 6:
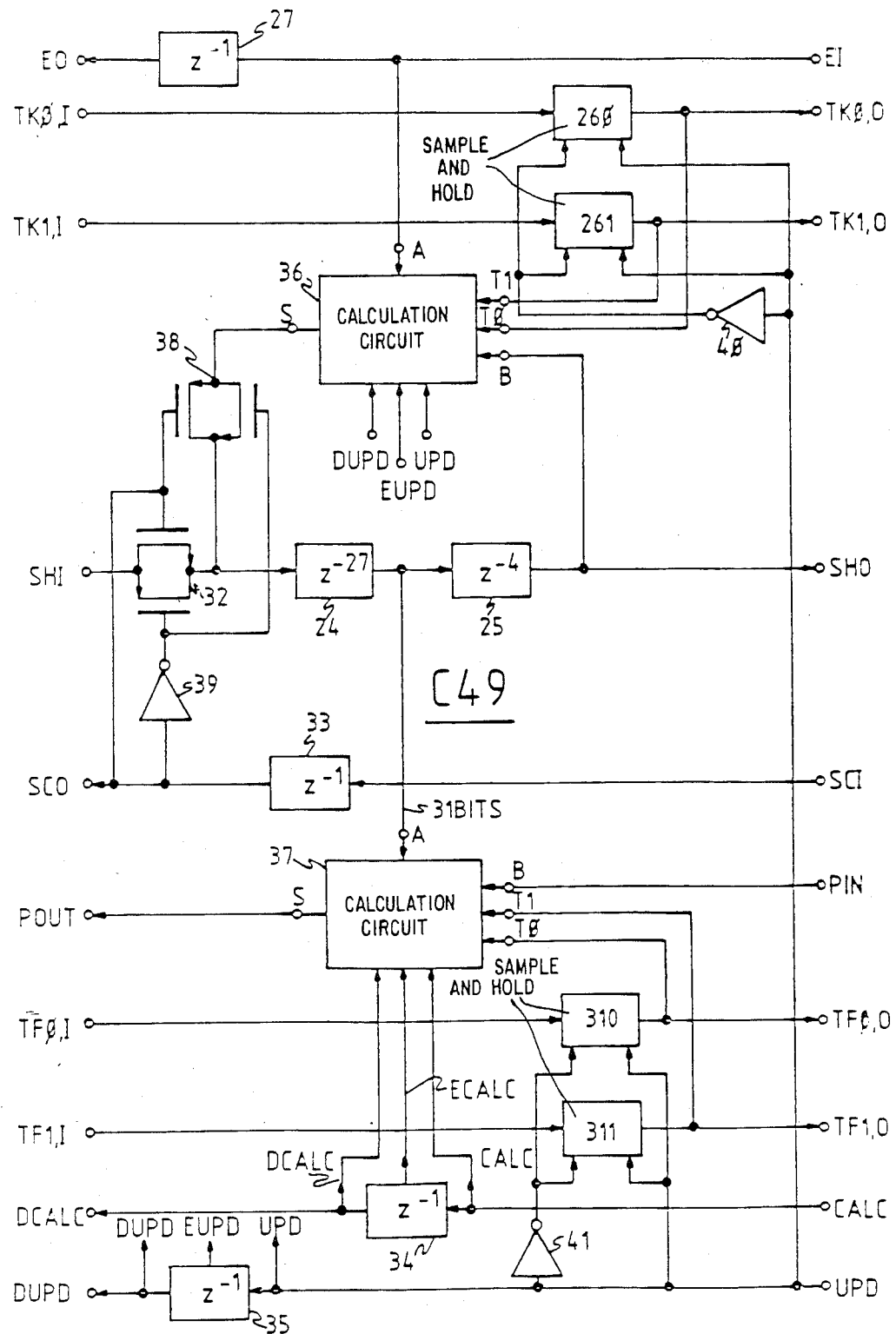
FIG. 6 shows cell C49 of FIG. 5 in more detail.

FIG. 6 represents cell C49 of FIG. 5 in more detail. This cell includes:

a one time slot delay unit 27 connected between terminals EI and EO;

triggered delay or sample and hold units 260 and 261 of 31 time slots connected between terminals TK0,I and TK0,O and between terminals TK1,I and TK1,O respectively. These units are substituted for unit 26 in FIG. 2;

triggered delay or sample and hold units 310 and 311 of 31 time slots connected between terminals TF0,I and TF0,O and between terminals TF1,I and TF1,O respectively. These units are substituted for unit 31 of FIG. 2;

delay units 24 (27 time slots) and 25 (4 time slots) connected in series with a passing gate 32 between terminals SHI and SHO;

a one time slot delay unit 33 connected between control terminals SCI and SCO;

a one time slot delay unit 34 connected between terminals CALC and DCALC and having an intermediate output terminals ECALC;

a one time slot delay unit 35 connected between terminals UPD and DUPD and having an intermediate output terminal EUPD;

a processing circuit 36 performing the functions of multiplier 21, adder 22 and delay unit 23 of FIG. 2 and having similar terminals A, B and S. It also has symbol input terminals T0 and T1 connected to the output terminals TK0,O and TK1,O of units 260 and 261 respectively, and update control terminals UPD, EUPD and DUPD connected to the above mentioned like named terminals of delay unit 35. The last mentioned terminals S and B are interconnected via the series connection of passing gate 38 and delay units 24 and 25;

a processing circuit 37 performing the functions of mulptlier 28, adder 29 and delay unit 30 of FIG. 2 and having similar input terminals T0 and T1 connected to terminals TF0,O and TF1,O respectively, and calculation control terminals CALC, FCALC and DCALC connected to the above mentioned like named terminals of delay unit 34. The last mentioned terminals B and S are connected to filter terminals PIN and POUT respectively.

The passing gates 32 and 38 are controlled in a reverse way from terminal SCO directly and through inverter 39. The sample and hold units 260 and 261 are controlled from terminal UPD directly and through inverter 40, whilst the sample and hold units 310 and 311 are controlled from the same terminal UPD directly and through inverter 41.

Figure 7:
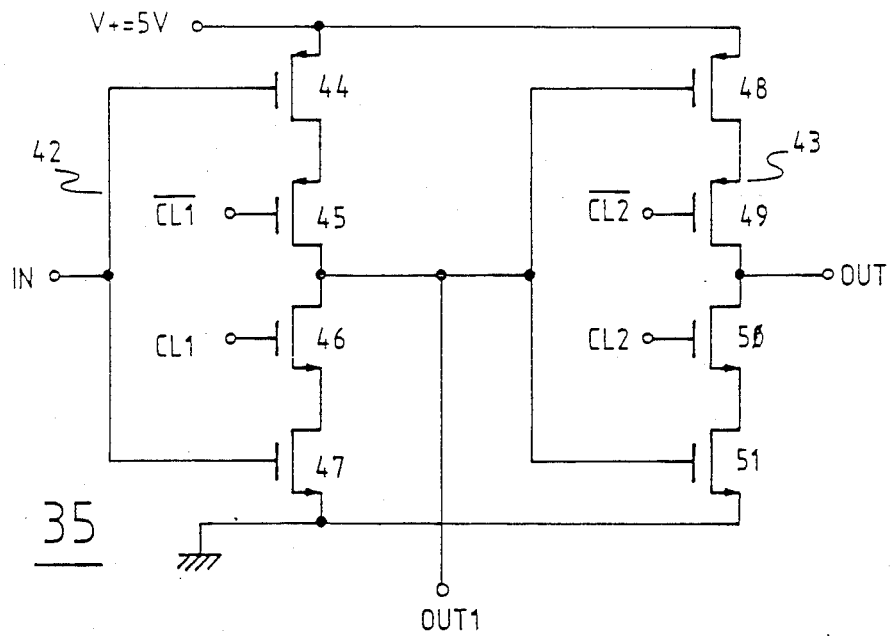
FIG. 7 shows delay unit 35 of FIG. 6 in detail.
Figure 8:
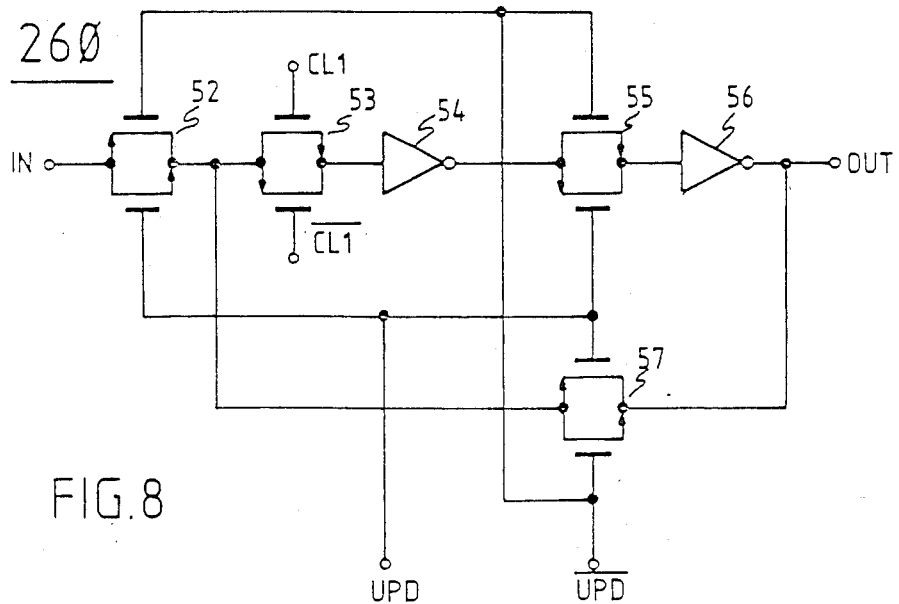
FIG. 8 represents delay unit 260 of FIG. 6 in detail.

The delay units 27, 33, 34 and 35 are of the type shown in FIG. 7; the sample and hold units 260, 261, 310 and 311 are of the type represented in FIG. 8 and the delay units 24 and 25 are constituted by 27 and 4 series connected delay units of FIG. 7 respectively. Finally, the processing circuits 36 and 37 are of the type shown in FIG. 9.

Figure 10:
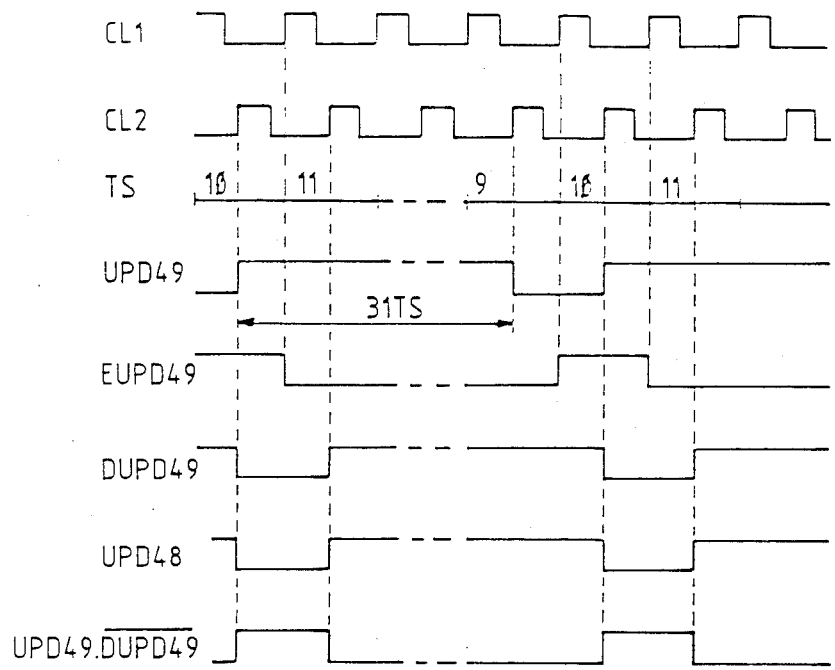
FIGS. 10 and 11 represent pulse waveforms used to control the cell C49 of FIG. 6.

The delay unit 35 which is similar to the delay units 27, 33 and 24 is represented in FIG. 7. It includes two series connected inverter circuits 42 and 43 each connected between V+ = 5 Volts and ground and controlled by clock pulses CL1, $\overline{CL1}$ and CL2, $\overline{CL2}$ respectively. As shown in FIG. 10, CL1 and CL2 are non-overlapping clock pulses, the leading edges of the clock pulses CL1 defining the above mentioned time slots. $\overline{CL1}$ and $\overline{CL2}$ are the inverse of CL1 and CL2 respectively and are not shown.

Inverter circuit 48 comprises PMOS transistors 44 and 45 and NMOS transistors 46 and 47 which are all connected in series between V+ and ground. The input terminal IN of the unit is connected to the gate electrodes of transistors 44 and 47 and the gate electrodes of transistors 45 and 46 are controlled by $\overline{CL1}$ and CL1 respectively. The interconnected electrodes of the transistors 45 and 46 are connected to an intermediate output terminal OUT1 and to the input of the inverter 43 which includes the transistors 48 to 51 all connected in a similar way as the transistors 44 to 47 and having output terminal OUT.

The delay unit 35 operates as follows when a control pulse waveform such as UPD49 (FIG. 10), which is UPD for C49, is applied to its input IN, this pulse waveform having a period of 32 time slots with a positively directed pulse of 31 time slots and a single negatively directed pulse of one time slot:

when UPD49 is activated (binary 1), then upon clock pulse CL1 being activated both transistors 46 and 47 become conductive so that the intermediate output OUT1 is grounded (binary 0);

on the contrary, when $\overline{UPD49}$ is de-activated (binary 0), then upon clock pulse $\overline{Cl1}$ being activated both transistors 44 and 45 become conductive so that the intermediate output OUT1 is then connected to V+ (binary 1).

It is clear that in this way the pulse waveform $\overline{UPD49}$ which is the inverse of UPD49 and shifted with respect to UPD by a period equal to the time interval between two successive clock pulses CL2 and CL1 appears at the outputs OUT1.

Because the inverter circuit 43 operates in the same way as the inverter circuit 42 the pulse waveforms DUPD49 which is the inverse of $\overline{UPD49}$ and shifted with respect to $\overline{UPD49}$ by a single time slot appears at the output OUT. FIG. 10 also shows the pulse waveform UPD49.$\overline{DUPD49}$.

Figure 11:
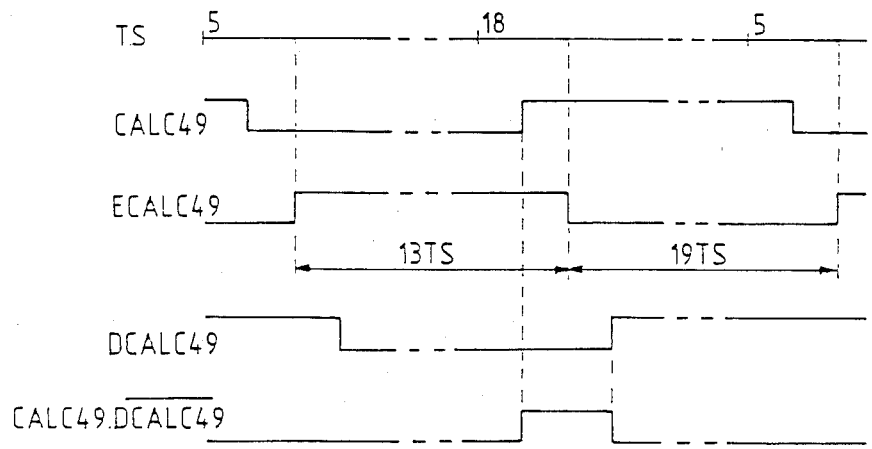

In a similar way, when the input pulse waveform CALC49 shows in FIG. 11 is applied to the input of the delay unit 34 the pulse waveforms ECALC49 and DCALC49 appear at the intermediate output and at the output of this unit respectively. The pulse waveform ECALC49 has a period of 32 time slots, with a negatively direct4ed pulse of 19 time slots and a positively directed pulse of 13 time slots. FIG. 11 also shows the pulse waveform CALC49.$\overline{DCALC49}$.

The sample and hold unit 260 of cell C49 which is similar to the units 261, 310 and 311 is shown in FIG. 8. Ithas an input terminal IN which is connected to its output terminal OUT via the series connection of passing gates 52 and 53, inverter 54, passing gate 55 and inverter 56 in series. The passing gates 52 and 55 are controlled from terminals UPD and $\overline{UPD}$ controlled by the above mentioned pulse waveform UPD49 and the inverse $\overline{UPD49}$ thereof respectively, whilst passing gate 53 is controlled by clock pulses CL1 and $\overline{CL1}$. The output OUT is also coupled back to the junction point of passing gates 52 and 53 via passing gate 57 which is also controlled by the pulse waveforms UPD49 and $\overline{UPD49}$.

The sample and hold unit 260 of cell C49 operates as follows, it being supposed that a symbol is stored in the output capacitance of the inverter 56 of the circuit 260 of cell C48 since the de-activation (binary 0) of the pulse waveform UPD48 in the course of TS10. This symbol remains at this output for 32 time slots i.e. until the start of CL2 in the following TS10:

when pulse waveform UPD49 becomes activated in TS10 for 31 time slots, only gate 52 is closed. The symbol applied to the unit 260 of C49 is then entered therein at the occurrence of each clock pulse CL1 since gate 53 is then closed. The symbol is tehreby stored in the parasitic output capacitance (not shown) of theinverter 54. It should be noted that because of the symbol rate being relatively high, i.e. 120 kbit/sec, a repeated sampling of the symbol is in fact not necessary in the present case;

when after 31 time slots waveform UPD49 is again de-activated in time slot TS9 then the gate 52 is opened thus isolating the input IN from the output OUT and the gate 55 is closed. The symbol stored in the output capacitance of the inverter 54 is then sampled and applied at the output OUT.

From the above it follows that the symbol which appeared at the output of the unit 260 of cell C48 in TS10 is generated at the output of the unit 260 of the cell C49 in TS9, i.e. 31 time slots later; there is a delay of 31 time slots between each cell and the following one in the series starting with C0. Hence, the delay of 31 time slots is realized in a particularly simple way by the use of a single pulse waveform UPD49 which is successively delayed by one time slot in the cells C49 to C0 to provide the successive corresponding symbol entering time slots. TS9 to TS26 respectively.

Figure 9:
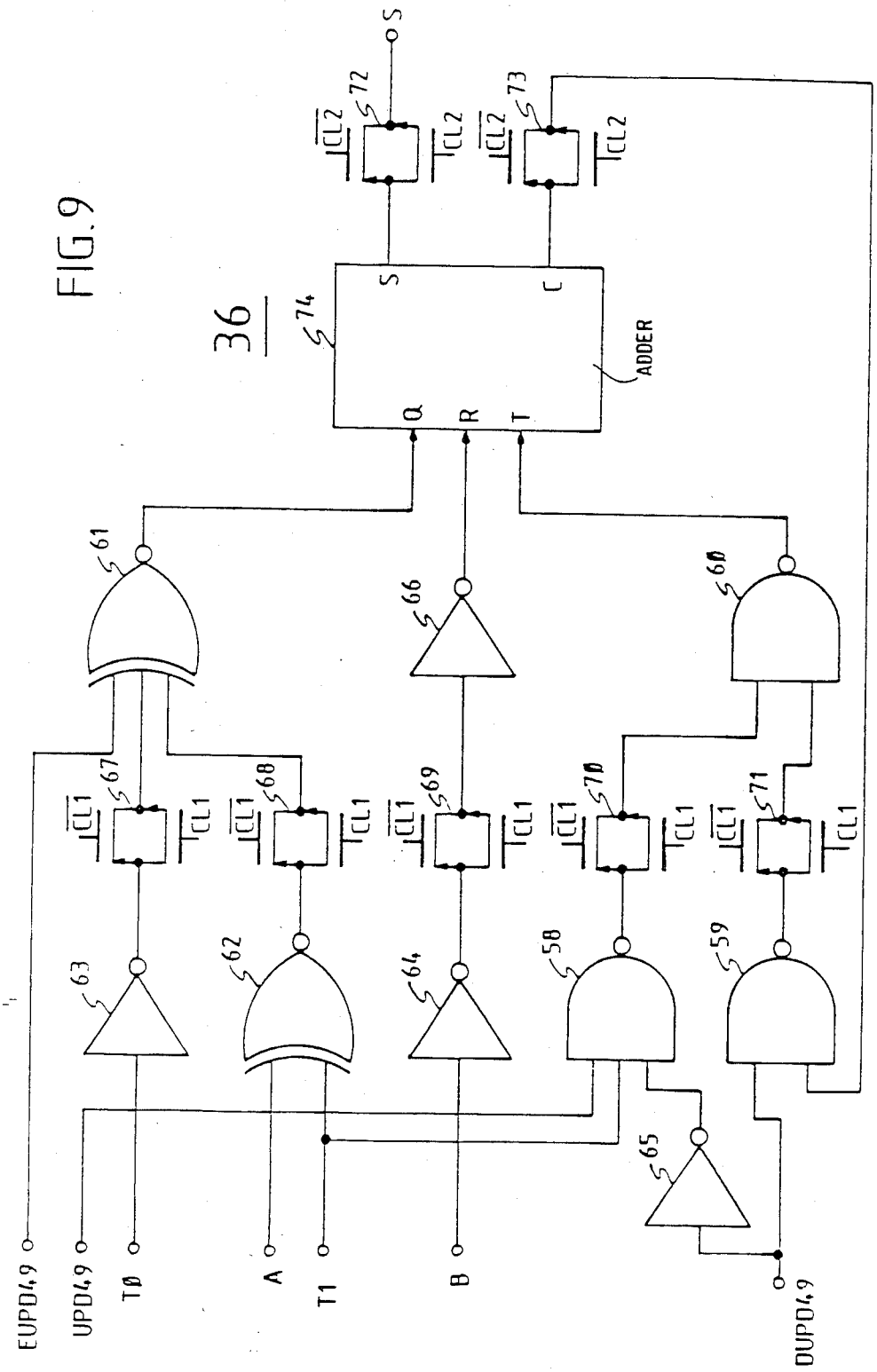
FIG. 9 represents processing circuit 36 of FIG. 6 in detail.

The processing circuit 36 represented in FIG. 9 has input terminals A, B, T0, T1, UPD, DUPD and EUPD and output terminal S. It includes a combinatorial logic circuit with NAND gates 58 to 60, NOR gate 621, Exclusive-NOR gate 62, inverters 63 to 66, passing gates 67 to 73 and a well known adder circuit 74 having inputs Q, R, T, sum output S and carry output C. The passing gate 67 to 71 are controlled by clock pulses CL1 and $\overline{CL1}$, whereas the passing gates 72 and 73 are controlled by clock pulses CL2 and $\overline{CL2}$. The signals Q, R and T applied to adder circuit 74 may be represented by the Boolean functions $$Q = \overline{EUPD49}/T0.(\overline{A}.T1 + \overline{A.T1}) \quad (7)$$

$$R = B \quad (8)$$

$$R = DUPD49.C + \overline{DUPD49}.UPD49.T1 \quad (9)$$

wherein A, B, T0, T1, EUPD49 and DUPD49 are the signals applied, together with UPD49, to the like named inputs of circuit 36 and C is the carry signal generated at the carry output C of the processing circuit 36.

The sum signal S appearing at the sum output S of the adder 74 is applied to the output S of circuit 36 via passing gate 72 clocked by CL2 and $\overline{CL2}$, whilst the carry signal C provided at the carry output C of this adder 74 is fed back to an input of the NAND-gate 59, to be used during a following calculation, via passing gate 73 also clocked by CL2 and $\overline{CL2}$.

From the relation (7) it follows that when $\overline{EUPD49} = 1$, the output signal Q is given by the following table

| Ternary value | T1 | T0 | Q |
|---|---|---|---|
| +1 | 0 | 1 | A |
| 0 | 0 | 0 | $\underline{0}$ |
| −1 | 1 | 0 | $\overline{A}$ |

The reason why $\overline{A}$ is applied to the adder input Q when the ternary value is −1 is that this subtraction is realized by using the two's complement of A which is obtained by taking the inverse $\overline{A}$ and adding a 1 to this value. This 1 is given by the term $\overline{DUPD49}.UPD49.T1$ in relation (9), T1 being only 1 for the ternary value −1.

The processing circuit 37 of FIG. 6 is identical to processing circuit 36 but is controlled by the above mentioned pulse waveforms CALC, ECALC and DCALC. The signals applied to the adder circuit 74 of circuit 37 are obtained by substituting the signals CALC, ECALC and DCALC for UPD, EUPD and DUPD in the relations (7), (8) and (9).

The operation of the filter circuit of FIG. 5 is generally similar to that of FIG. 2 and will therefore not completely be repeated. However, because the operation of the cells is slightly different, the functioning of cell C49 is considered hereinafter by making reference mainly to FIGS. 4, 6 and 9 to 12.

The pulse waveform UPD49 (FIG. 10) is applied to input terminal UPD of cell C49 (FIG. 6) whose input terminal PIN is grounded. Its successive edges occur in time slots TS9 and TS10 in coincidence with clock pulses CL2. The pulse waveform CALC49 (FIG. 11) is applied to input terminal CALC of cell C49. Its successive edges occur in time slots TS5 and TS18. The pulse waveforms UPD49 and CALC 49 are applied to delay circuits 35 and 34 at the outputs of which appear the pulse waveforms EUPD49, DUPD49 and ECALC49, DCALC49 respectively. These pulse waveforms are applied to the corresponding input terminals of the processing circuits 36 and 37 to which also the pulse waveforms UPD49 and CALC49 are applied.

When UPD49 becomes de-activated during TS9 the bits T0 and T1 of an input symbol are entered in the uints 260 and 261 respectively, whilst the symbol bits T0 and T1 of another symbol are then entered in the units 310 and 311. These symbol bits are thus applied to the inputs T0, T1 of the processing circuits 36 and 37 respectively.

In the circuit 36 the above mentioned error signal Di is applied to the input terminal A upon the occurrence of clock pulse CL2 of TS25 (FIG. 4) and the same is true for the filter coefficient calculated during a previous symbol period and applied to input terminal B of the processing circuit 36. By the clock pulse CL1 at the start of time slot TS11 the signals at the terminals T0, T1, A, B, UPD and the carry bit C are entered in the processing circuit 36. Because the signal EUPD49 is de-activated from the start of TS11 the signal applied to the adder input Q of the adder circuit 74 is then equal to A, 0 or $\overline{A}$. The signal applied to the adder input R is equal to that applied to terminal B of the processing circuit 76. Since the start of TS11 also the bit T1 is applied to the adder circuit 82 because $\overline{DUPD4-9}.UPD49$ is then activated. On the contrary, for the first symbol bit under consideration the term DUPD49.C is de-activated since for this first bit no carry has to be added. The sum and carry output signals S and C generated by the adder circuit 74 are provided upon the occurrence of clock pulse CL2 during time slot TS11.

From the above it follows that the first bit of the calculated filter coefficient appears at the output S of the processing circuit 36 during time slot TS11. The following bits 1 to 30 are generated in the same way during the successive time slots TS12 to TS9 (FIG. 12), no bit 31 being generated because EUPD49 is then activated (FIG. 11). The bits of the 31-bit filter coefficient thus obtained are applied to the delay unit 24 via passing gate 38 which is supposed to be closed because terminal SCO is de-activated. In the delay unit 24 these bits are delayed by 27 time slots so that they appear at the input A of the processing circuit in FIG. 12. These bits are also fed back to the input B of the circuit 36 via the gate 38 and delay units 24 and 25 in series in order to be used during a subsequent operation.

Figure 12:
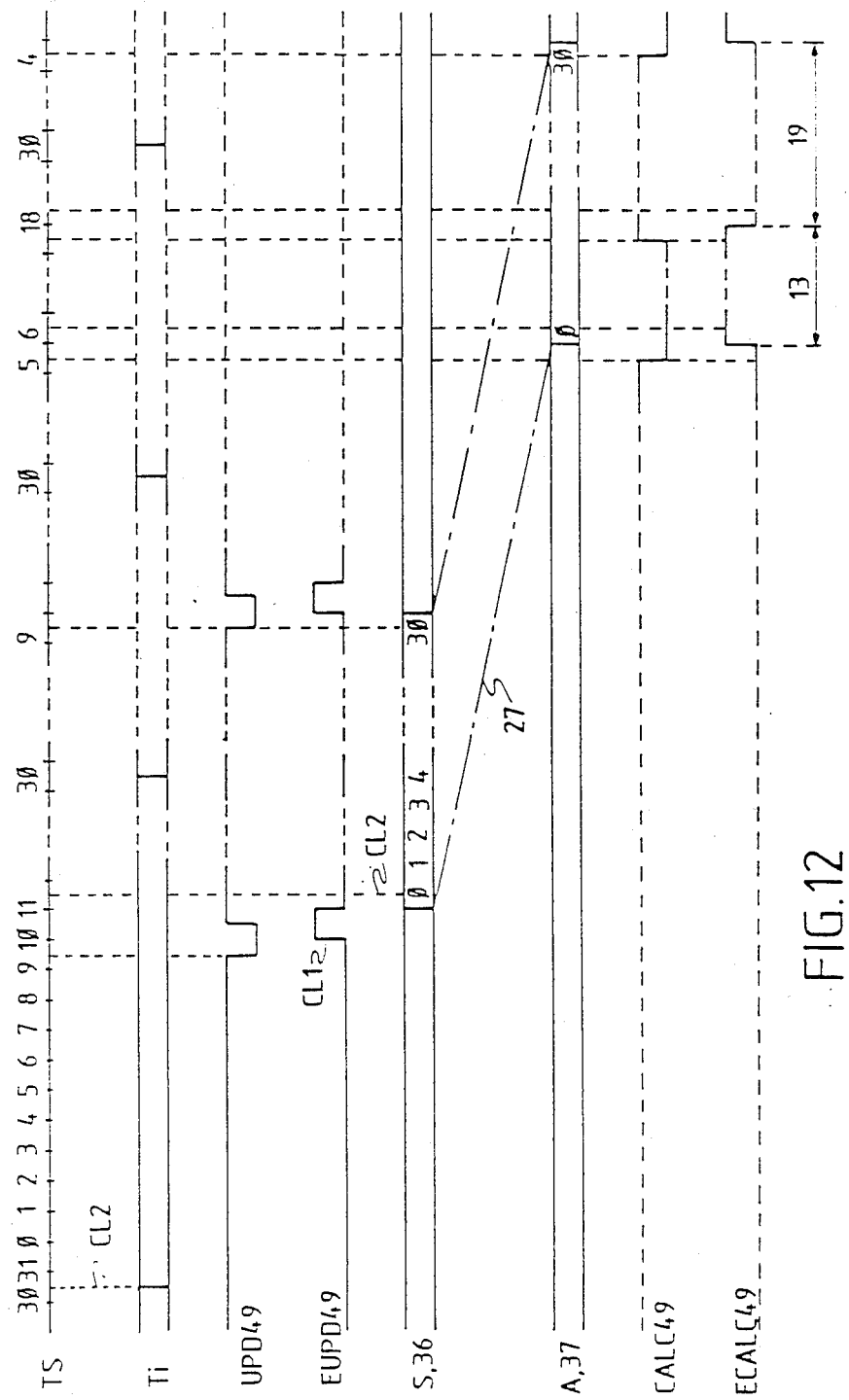
FIG. 12 is used to illustrate the operation of this cell C49.

In the processing circuit 37 the signals applied to the inputs A, B, T0, T1, CALC, CALC, DCALC are processed in the same way as described for processing circuit 36. However, with the control signal ECALC49 being de-actived for 19 time slots TS18 to TS4, the filter coefficient generated has only 19 bits, as shown in FIG. 12. The resultant filter output bits appearing at the output S of the circuit 37 are successively applied to the output terminal POUT and from there to the input terinal PIN of the cell C48 (not shown). Therein they are each used during the following time slot to calculate another filter output as already explained in relation to FIGS. 2 and 4. The cell C48 also receives the error signal Di after the latter has been delayed by one time slot in delay unit 27, as well as the signals DUPD and DCALC.

In the above description of cell C49, gate 38 was supposed to be closed due to the input SCIN of C49 being de-activated. In this case gate 32 of C49 was open. To reverse this situation it is sufficient to activate this input. This may for instance be required when the updated filter coefficients $K_{49,i}$ to $K_{0,i}$ have to be read out one after another.

As mentioned above these coefficients $K_{49,i}$ to $K_{0,i}$ are 31-bit words the bits of which are successively generated at the outputs S of the units 36 of the cells C49 to C0 with a time shift of one time slot. To read out the complete coefficients one after another, it is sufficient to apply an activated pulse waveform to the above input SCIN after this coefficient $K_{49,i}$ has been completely entered into the delay units 24 and 25 of C49 and start the shifting out operation. Indeed, although at that moment the coefficients $K_{48,i}$ to $K_{0,i}$ have not completely been entered into the delay/units 24 and 25 of their respective cells C48 to C0 there remains sufficient time to do so because the above pulse waveform applied to input SCIN is delayed by one time slot in each cell so that the gates 32 of the cells C49 to C0 are also closed in succession. By the presence of these delay units a dummy 32 th bit is also inserted after each coefficient to that 32-bits appear without interruption of the output SHOUT of cell C49.

To be noted is that the last described connection can also be used to introduce filter coefficients at the start of an operation and that the described adapted transversal filter can also be used for the adaptive equalizer 16 of FIG. 1.

While the principles of the invention have been described above in connection with specific apparatus it is to be clearly understood that this description is made only by way of example and not as a limitation on the scope of the invention.

We claim:

1. Signal processing arrangement including at least one processing device with a series of interconnected processing cells (SC'0/49, SC0/49) which are each to calculate a same function of the type p+mn of three periodic variables m, n and p which are applied to first (TFI, TKI), second (A) and third (B) inputs of said cells which further have a first output (TFO, TKO) connected to the firs tinput of a following cell considered in the direction from a first cell to a last cell and a second output (S) on which appears the result of a cell calculation, said variables m and n being input variable sand said variable p being the result of the calculation of said function p+mn in a previous cell, and corresponding variables m, n and p applied to said cells and provided by said cells being successively time shifted with respect to one another, characterized in that each of said cells (SC'0/49, SC0/49) includes calculation means (37, 36) which calculates said function in a bit serial way and provides an output bit in every time slot, with said variable m ($T_{i-k}$) having a duration of q (32) time slots and said variable n ($K_{k,i}$, $D^i$) comprising a number of at most q bits each having a duration of one time slot, and that in each cell said first input (TFI, TKI) is connected to said first output (TFO, TKO) via a sample and hold circuit (310, 311; 260, 261) whose output is connected to an input (T0, T1) of said calculation means to supply said variable m thereat, the sample and hold circuits of said successive cells being controlled by respective ones of time shifted control signals (UPD0/49) which are successively delayed with respect to one another by one time slot when considered in a direction opposite to said first mentioned one, in such a way that the variables m supplied to said successive cells are mutually delayed by q−1 time slots when considered in said first mentioned direction.

2. Signal processing arrangement according to claim 1, characterized in that said control signal (UPD0/49) controlling said sample and hold circuit (310, 311; 260, 261) has a period of q (32) time slots with a first portion having a duration of q−1 time slots and a second portion with a duration of one time slot, said first portion defining the sampling period and said second portion defining the time slot in which said variable m is applied to said calculation means (37, 36).

3. Signal processing arrangement according to claim 2, characterized in that in said sample and hold circuit (310, 311; 260, 261), said first input (TF1) is connected to said firs toutput (TFO) via the series connection of a first (52) and a second (53) passing gates, a first inverter (54), a third passing gate (55) and a second inverter (56), whose output is coupled to the junction point of said first (532) and second (53) passing gates via a third passing gate Z(57), said first passing gate (52) being closed by said first portion of said control signal (UPD0/49), said third (55) and fourth (57) passing gates being both closed by said second portion of said control signal (UPD0/49) and said second passing gate (53) being alternately closed and opened in each time slot under the control of a clock signal (CL1).

4. Signal processing arrangement according to claim 1, characterized in that said claculation means (37, 36) are controlled by a claculation enabling signal (ECALC, EUPD) and by a two-phase clock signal (CL1, CL2) defining an input and calculation phase (CL1) and an output phase (CL2), both said phase occurring successively in one time slot.

5. Signal processing arrangement according to claim 1, characterized in that said processing device (FC) is a digital filter including n+1 cells (SC'0/49) each kth cell (k=0, . . . ,n) of which is able to calculate in each period i of said variable m said function which is of the type $$P_{k,i} = K_{k,i} T_{i-k} + P_{k+1,i}$$

with k varying from O to n with $P_{n+1,i} = 0$. wherein
   m=$T_{i-k}$ is a data symbol,
   n=$K_{k,i}$ is a filter coefficient and
   p =$P_{k+1,i}$ is the result of the previous calculation performed during a preceding time slot in the (k+1)th cell of said series of cells numbered in increasing order in said first mentioned direction.

6. Signal processing arrangement according to claim 5, characterized in that said arrangement is an adaptive digital filter including said digital filter (FC) and a second said processing device which is a digital filter coefficient updating circuit (CUC) including n+1 cells (SCO/49) each k th cell (k=O, . . . ,n) of which is to calculate in each period i of said variable m an updated filter coefficient $K_{k,i}$ according to said function which is of the type $K_{k,i} = D_i T_{i-k} + K_{k,i-1}$ with k varying from O to n−1 wherein m=$T_{i-k}$ is a date symbol, n=$D_i$ is a filter coefficient updating signal and p=$k_{k,i-1}$ is the updated filter coefficient obtained as a reuslt of the previous calculation performed in said k the cell during a preceding period of $T_{i-k}$.

7. Signal processing arrangement according to claim 6, characterized in that said adaptive filter is an echo canceller a (15) forming part of a telecommunication switching system with a transmission path and a receive path coupled to respective first and second terminals of a hybrid circuit (7) whose third terminal is coupled to a bidirectional transmission line (2), said transmission path being also coupled through said echo canceller (15) to one input of a subtractor (13) whose other input is coupled to said second terminal of said hybrid circuit (7) and the output of which is coupled to said receive path, said filter coefficient adapting signal ($d_i$) being the error signal generated at said output (D) of said subtractor (13).

8. Signal processing arrangement according to claim 7, characterized in that said error signal ($D_i$) is applied via a possible first delay to said third input of the k $=n^{th}$ cell (SC49) of said filter coefficient adapting circuit (CUC) and that said data symbol ($T_{i-k}$) is applied to said first input of said k$=0^{th}$ cell (SC'0) of said digital filter (FC) directly and via a second delay (20) to said first input of said k$=0^{th}$ cell (SC0) of said digital filter coefficient adapting circuit (CUC), said second delay being chosen in function of said first delay and said value n to permit the correlation of said error signal ($D_i$) and said data symbol ($T_{i-k}$) in each of said cells (SC'0/49).

9. Signal processing arrangement according to claim 6, characterized in that said updated filter coefficient ($K_{k,i}$) generated at the output of said $k^{th}$ cell of said filter coefficient adapting circuit (CUC) is fed to said $k^{th}$ cell of said filter (FC) via a third delay (24).

10. Signal processing arrangement according to claim 9, characterized in that: said calculation means (37,36) are controlled by a calculation enabling signal (ECALC, EUPD) and by a two-phase clock signal (CL1, CL2) defining an input and calculation phase (CL1) and an output phase (CL2), with both said phases occurring successively in one time slot; in said digital filter coefficient adapting circuit (CUC0 said calculation enabling signal (EUPD) is derived from said control signal (UPDO/49); and in said digital filter (FC) said calculation enabling signal (ECALC) is derived from a second control signal (CALC) which is shifted with respect to said first mentioned control signal (UPD0/49) to take said third delay (24) into account.

11. Signal processing arrangement according to claim 10, characterized in that said calculation means (36) of said digital filter coefficient updating circuit (CUC) includes a combinatorial logic circuit (58-71) which is connected to a three-input adder circuit (74), said combinatorial logic circuit being controlled by said two-phase clock (CL1, CL2) and having said second (A) and third (B) inputs, said second output (S), said input connected to said output of said sample and hold circuit (260, 261) and control inputs controlled by said control signal (UPD49), said calculation enabling signal (EUPD49) and a second control signal (DUPD49) obtained by delaying said control signal by one time slot, and outputs Q, R and T, said combinatorial logic circuit being able to generate output signals Q, R and T in said like named outputs
Q $=$EUPD.T0($\overline{A}$.t1 $+$A.$\overline{T1}$)
R $=$B
R $=$DUPC.C$+\overline{DUPD}$.UPD.T1
wherein EUPD is said calculation enabling signal;

A is said error signal ($D_i$)
B is said previous result ($K_{k,i-1}$)
DUPD is said second control signal
T0 and T1 together constitute said data symbol ($T_{i-k}$)
C is a carry signal
said output signals being generated during said input and calculation phase (CL1) and being then applied to the three inputs (Q, R, T) of said adder circuit (74) which during said output phse (CL2) generates an output signal on said second output (S) and said carry signal (C) which is fed back to a further input of said combinatorial logic circuit (59-721).

12. Signal processing arrangement according to claim 10, characterized in that said calculation means (37) of said digital filter circuit include a combinatorial logic circuit which is connected to a three-input adder circuit (74), said combinatorial logic circuit being controlled by said two-phase clock (CL1, CL2) and having said second (A) and third (B) inputs, said second output (S), said input connected to said output of said sample and hold circuit (310, 311) and control inputs controlled by said control signal (CALC49), said calculation enabling signal (ECALC49) and a second control signal (DCALC) obtained by delaying said control signal by one time slot, and outputs Q, R and T, said combinatorial logic circuit being able to generate output signals Q, R and T on said like named outputs
Q$=$ECALC.T0.($\overline{A}$.T1$+$A.$\overline{T1}$)
R$=$B
T$=$DCALC.C$+\overline{DCALC}$ . CALC.T1
wherein ECALC is said calculation enabling signal;
A is said filter coefficient ($K_{k,i}$);
B is said previous result ($P_{k+1,i}$);
T0 and T1 together constitute said data symbol ($T_{i-1}$)
C is a carry signal
said output signals being generated during said input and calculator phase (CL1) and being then applied to the tree inputs (Q, R, T) of said adder circuit (74) which during said output phase (CL2) generates an output signal on said second output (S) and said carry signal (C) which is fed back to a further input of said combinatorial logic circuit (58-71).

13. Signal processing arrangement according to claim 1, characterized in that said processing device (CUC) is a digital coefficient updating circuit including n$+$1 cells (SC0/49) each k th cell (k$=$0, . . . ,n) of which is to calculate in each period i of said variable m an updated filter coefficient $K_{k,i}$ according to said function which is of the type $$K_{k,i}=D_iT_{i-k}+K_{k,i-1}$$

with k varying from O to n$-$1 wherein m$=T_{i-k}$ is a data symbol, n$=D_i$ is a filter coefficient updating signal and p$=k_{k,i-1}$ is the updated filter coefficient obtained as a result of the previous calculation performed in said k th cell during a preceding period of $T_{i-k}$.

14. Signal processing arrangement according to claim 13, characterized in that said second output (S) of said $k^{th}$ cell is connected to said third input (B) thereof via a fifth passing gate (38) and a delay means (24, 25) of one data symbol period, the junction point of said passing gate (38) and said delay means (24, 25) being connected to a sixth gating means (32) which is connected in series with said delay means (24, 25) between a fourth input (SHI) and a fourth output (SHO) connected to an output and an input of said $(k-1)^{th}$ and said $(K+1)^{th}$ cell respectively, and that a fifth input (SCI) of said $k^{th}$ cell is connected to a fifth output (SCO) thereof via a one time slot delay means (33), said fifth input (SCI) and output (SCO) being connected to an output and an input of said $(k+1)^{th}$ cell and said $(k-1)^{th}$ cell respectively, said fifth (38) and sixth (32) passing gates being controlled in a reverse way from said fifth output (SCO).

* * * * *